(12) United States Patent
Massie et al.

(10) Patent No.: US 7,746,156 B1
(45) Date of Patent: Jun. 29, 2010

(54) CIRCUIT AND METHOD FOR DRIVING A JUNCTION FIELD EFFECT TRANSISTOR

(75) Inventors: Harold L. Massie, Medical Lake, WA (US); Kuang Ming Daniel Chang, Fremont, CA (US)

(73) Assignee: QSpeed Semiconductor Inc., Santa Clara, CA (US)

( * ) Notice: Subject to any disclaimer, the term of this patent is extended or adjusted under 35 U.S.C. 154(b) by 224 days.

(21) Appl. No.: 11/787,456

(22) Filed: Apr. 16, 2007
(Under 37 CFR 1.47)

Related U.S. Application Data

(60) Provisional application No. 60/792,295, filed on Apr. 14, 2006.

(51) Int. Cl.
*H03K 17/687* (2006.01)
(52) U.S. Cl. .................. 327/427; 327/421; 327/430
(58) Field of Classification Search .............. 327/421, 327/427, 430
See application file for complete search history.

(56) References Cited

U.S. PATENT DOCUMENTS

| | | | | |
|---|---|---|---|---|
| 3,740,581 A | * | 6/1973 | Pfiffner | 327/377 |
| 6,661,276 B1 | * | 12/2003 | Chang | 327/427 |
| 7,233,191 B2 | * | 6/2007 | Wang et al. | 327/430 |
| 2005/0212583 A1 | * | 9/2005 | Pai | 327/427 |
| 2007/0146020 A1 | * | 6/2007 | Williams | 327/110 |

* cited by examiner

*Primary Examiner*—Lincoln Donovan
*Assistant Examiner*—John W Poos
(74) *Attorney, Agent, or Firm*—Morgan, Lewis & Bockius LLP

(57) ABSTRACT

A circuit and method for driving a field effect transistor is disclosed. A switching circuit includes a driver device having a signal input, a supply voltage input, and an output. The driver output is coupled to a JFET. A converter couples to the JFET and provides an output of the switching circuit. When enabled, a switching device couples this switching circuit output to the gate of the JFET, thus causing the JFET to be driven into conduction.

22 Claims, 6 Drawing Sheets

US 7,746,156 B1

CIRCUIT AND METHOD FOR DRIVING A JUNCTION FIELD EFFECT TRANSISTOR

CROSS-REFERENCE TO RELATED APPLICATIONS

This application claims benefit to U.S. Provisional Patent Application Ser. No. 60/792,295, filed Apr. 14, 2006, entitled "Circuit and Method for Driving a Junction Field Effect Transistor," which is incorporated herein by reference in its entirety.

This application also related to U.S. Pat. No. 6,661,276, which issued on Dec. 9, 2003, entitled "MOSFET Driver Matching Circuit for an Enhancement Mode JFET," which is incorporated herein by reference in its entirety.

TECHNICAL FIELD

The present invention relates to the field of field effect transistors (FETs). More specifically, embodiments of the present invention relate to circuits and methods for driving a junction field effect transistor.

BACKGROUND

Field Effect Transistors (FET) include metal oxide semiconductor FET (MOSFET) devices and junction FET (JFET) devices. Historically, the use of MOSFETs has been more widespread than that of JFETs. As a result of their widespread use, driver circuits and other circuits for MOSFETs are readily and economically available. One such circuit is a MOSFET based converter circuit.

A schematic of a typical MOSFET converter circuit 100 is shown in Prior Art FIG. 1. MOSFET converter circuit 100 includes a driver circuit 110, which functions as a gate driver. MOSFET gate driver 110 is configured to drive high side MOSFET Q102 and low side Q1 MOSFET Q101. Driver 110 generates high peak currents for switching the MOSFETs Q101 and Q102 on and off.

Resistors R111 and R112 are typically relatively small value resistors. Resistors R111 and R112 deter oscillations. The high side gate switching waveform V2 is in phase with the driver input signal V1. The low side gate switching waveform V3 is out of phase with input signal V1. A high output from driver U110 turns on the MOSFETs Q102 and Q101.

Converter circuit 103 has an output inductor L131 and output filter capacitor C141. The inductive-capacitive network of converter 103 convert the switching waveform of Q101 and Q102 to a DC output voltage Vo.

Although significant bias current is not needed at the gates of MOSFETs Q102 and Q101, in applying their full bias voltage, power is dissipated in resistors R111 and R112. This dissipation of power reduces the efficiency of driver circuit 100.

Junction field effect transistors (JFETs) are majority carrier devices that conduct current through a channel that is controlled by the application of a bias voltage to a p-n junction. Minimal on state drain-source resistance ($R_{DSOn}$) characterizes efficient device performance. Low $R_{DSOn}$ is typically achieved with a significant DC driving current $I_{Bias}$ providing the voltage to bias the FET.

Although MOSFET based circuitry is readily and economically available, a growing demand for JFET based circuitry has developed. In part, this is understandable from advances that have accompanied the adoption of submicron processes for device fabrication, such as operationally higher speeds and lower voltages. For instance, greater current demands in integrated circuits have resulted in JFET based circuitry, such as in power conditioning. Exemplary circuits include buck converters and switching power supplies.

Switching mode regulators are preferred to linear devices due to considerations related to efficiency. For instance, efficiency can be increased by operating a switch (e.g., the transistor) so that it is either fully on or fully off. Circuits used to drive a transistor for a switching application are designed with the goal of providing a fast transition between the "on" and "off" states of the transistor switch.

JFETs are capable of being driven by low voltages while maintaining excellent breakdown characteristics when compared to MOSFETs. There is no insulator associated with gate/drain and gate/source interfaces of a JFET (e.g., these interfaces comprise p-n junctions). Thus, forward bias results in conduction at voltages that are very low compared to the reverse bias that the device is capable of withstanding. JFETs also have a much greater resistance to damage from electrostatic discharge (ESD) than MOSFETs. Thus, JFET circuit use may be preferable to MOSFET circuits for a particular application.

Due to the fundamental differences between MOSFETs and JFETs, conventional MOSFET drivers such as circuit 100 are not well suited for driving JFETs. For instance, while MOSFETs may be biased without significant bias current $I_{Bias}$, modern JFET bias currents range from 1 to 200 mA.

One approach to providing sufficient JFET biasing current has been to provide a direct drive from a gate driver circuit. The voltage of such drivers can range in some applications from 5 to 12 V. A schematic of a conventional JFET direct drive gate driver circuit 200 is depicted in prior art FIG. 2. Direct JFET driver circuit 200 supplies high peak switching currents as well as the DC bias current in the range of 1 ma to 200 ma.

Circuit 200 directly drives JFET transistors Q203 and Q204 in that the DC bias current is supplied from the voltage driver U210 itself. Circuit 200 also provides negative voltage to the gates when the JFETs Q203 and Q204 are in an "off" state. This negative voltage keeps the JFET in a low leakage off state, which supports proper operation for depletion JFETs.

Capacitors C222 and C223 in the gate circuits 224 and 225, respectively, provide the high peak switching drive currents. Resistors 8233 and R234 set the DC gate bias currents. The negative voltage is generated because the positive voltage at the gate is clamped by a gate to source diode effect within each JFET when the driver voltage goes positive. MOSFETs, such as Q101 and Q102 (FIG. 1) do not have this built in diode effect between gate and source.

The high side gate switching waveform V4 is in phase with the driver input signal V1. The low side gate switching waveform V5 is out of phase with input signal V1. When the driver voltage swings to 0V, the voltage at the JFET gate swings to a negative voltage because it was clamped at +0.7V when the driver output voltage was high.

Converter circuit 203 has an output inductor L231 and output filter capacitor C241. The inductive-capacitive network of converter 203 converts the switching waveform of Q203 and Q204 to a DC output voltage Vo.

Circuit 200 functions to drive the JFETs Q203 and Q204. However, driving $I_{Bias}$ directly can consume significant power, which can adversely affect the efficiency of the power supply. For instance, in applying full bias voltage to JFETs Q203 and Q204, the bias currents may dissipate significant power in resistors R233 and R234, which thus typically have relatively high wattage ratings.

This dissipation of power reduces the efficiency of such a conventional driver circuit. Further, their relatively high wattages render biasing resistors in such a driver circuit concomitantly large and require apparatus in which the circuit is disposed or deployed to dissipate the heat they generate. This can require larger size (e.g., form factor), heavier weight, and more robust thermal design for such an apparatus, all of which can reduce its economical manufacture and utility. These factors may thus delimit the range of application for such a circuit. Thus, the direct drive approach to biasing a JFET converter circuit can be inefficient, power intensive, and restrictive.

SUMMARY

What is needed is a circuit for driving JFETs that consume relatively little current and power, and which is thus efficient. What is also needed is a circuit for driving JFETs that can use resistances having relatively low power ratings, which does not require large size, heavy weight, and especially robust thermal design. Further, what is needed is a circuit for driving JFETs that is relatively economical to manufacture and utilize and has a wide range of application.

A circuit and method for driving a junction field effect transistor are disclosed. The circuit and method disclosed consume relatively little current and power, and are thus concomitantly efficient. The circuit and method disclosed also include a resistance having a relatively low power rating, which can be of a concomitantly small size (e.g., form factor), light weight, and without special thermal robustness. Further, the circuit and method disclosed are relatively economical to manufacture and utilize and has a wide range of applications.

In one embodiment, a switching circuit includes a driver device having a signal input, a supply voltage input, and an output. The driver output is coupled to a JFET. A converter couples to the JFET and provides an output of the switching circuit. When enabled, a switching device couples this switching circuit output to the gate of the JFET, thus causing the JFET to be driven into conduction.

DETAILED DESCRIPTION

A circuit and method for driving a junction field effect transistor is disclosed. Reference is now made in detail to embodiments of the invention, examples of which are illustrated in the accompanying drawing figures. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, one of ordinary skill in the art will realize that embodiments of the present invention may be practiced without these specific details. In other instances, well-known methods, systems, components, and circuits have not been described in detail so as not to unnecessarily obscure aspects of the present invention.

Portions of the detailed description that follows are presented and discussed in terms of methods (e.g., processes). Although steps and sequencing thereof are disclosed in figures herein (e.g., FIGS. 4 and 6) describing the operations of these methods (e.g., methods 400 and 600, respectively), such steps and sequencing are exemplary. Embodiments of the present invention are well suited to performing various other steps or variations of the steps recited in the flowcharts of the figures herein, and in a sequence other than that depicted and described herein.

In one embodiment, a switching circuit includes a driver device having a signal input, a supply voltage input, and an output. The driver output is coupled to a JFET. A converter couples to the JFET and provides an output of the switching circuit. When enabled, a switching device couples this switching circuit output to the gate of the JFET, thus causing the JFET to be driven into conduction.

Therefore, a JFET such as an enhancement mode JFET can be driven with relatively low current and power consumption, and thus efficiently. The circuit disclosed also includes a resistance having a relatively low power rating compared to conventional techniques for driving JFETs. Thus, the circuit can be used in applications needing small size (e.g., form factor), light weight, and without special thermal robustness that may characterize some prior art JFET driving techniques. Further, the circuit disclosed is relatively economical to manufacture and utilize and has a wide range of applications.

This application hereby incorporates by reference, in its entirety, U.S. Pat. No. 6,661,276 to Daniel Chang, entitled MOSFET Driver Matching Circuit for an Enhancement Mode JFET, which issued on Dec. 9, 2003, and which is assigned to the Assignee of the present invention.

Exemplary JFET Driving Circuits

Figure 1:
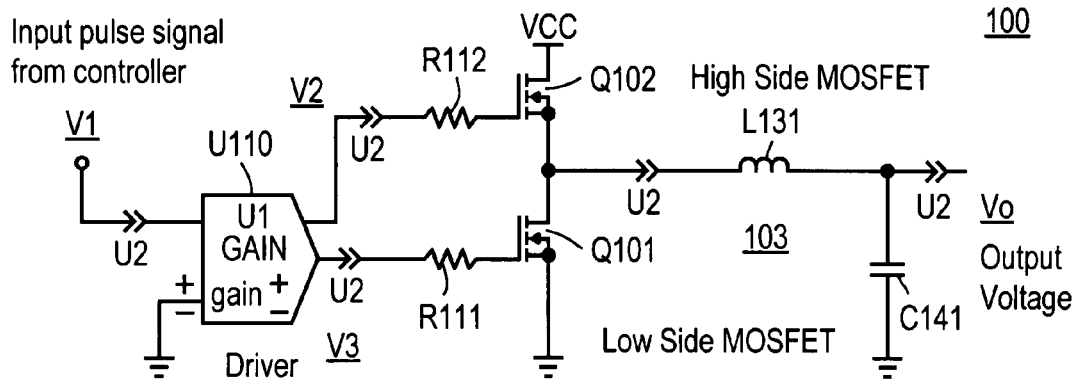
FIG. 1 depicts a prior art MOSFET gate driver configuration.
Figure 2:
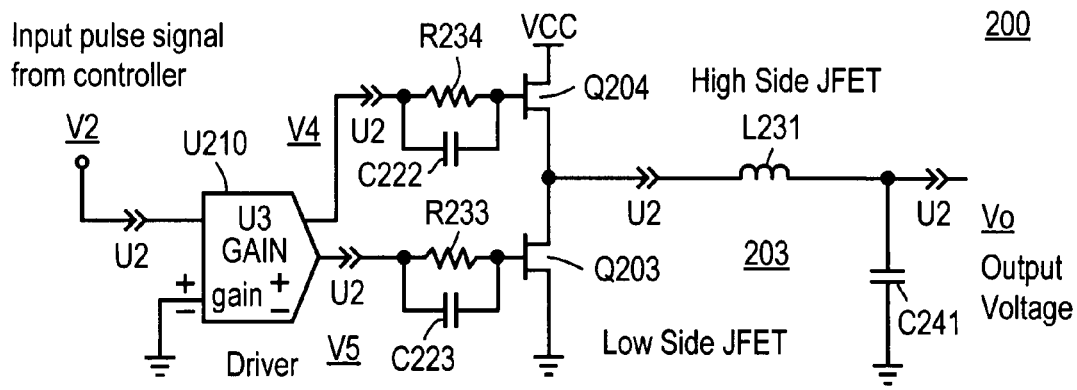
FIG. 2 depicts a prior art direct drive JFET gate driver configuration.
Figure 3:
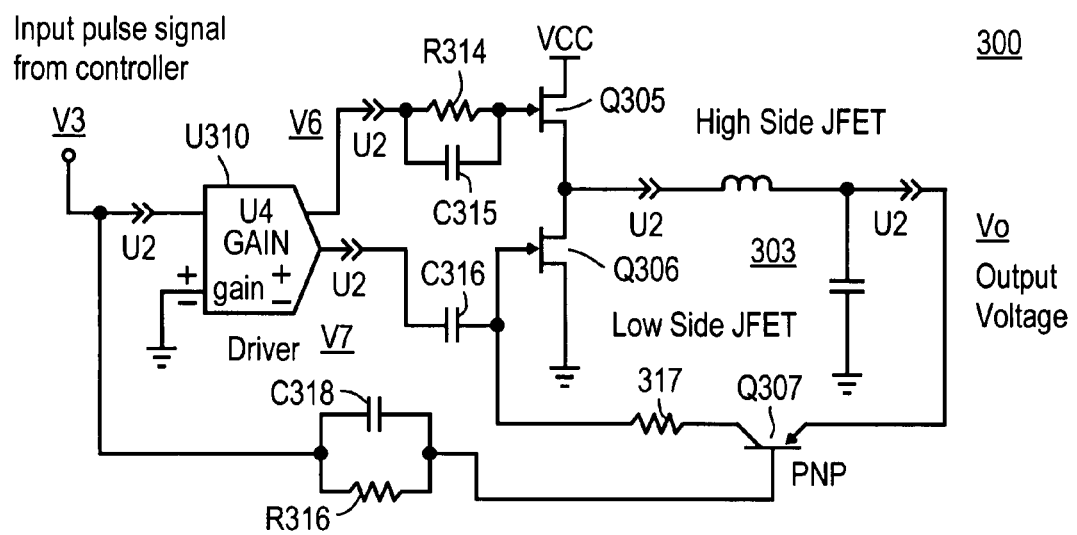
FIG. 3 depicts an exemplary JFET driver circuit, according to one embodiment of the present invention.

FIG. 3 depicts an exemplary JFET driver circuit 300, according to one embodiment of the present invention. Circuit 300 has a low side JFET Q306 and a high side JFET Q305 and a gate driver U310. Capacitors C315 and C316 provide sufficient peak currents for respectively switching the JFETs Q305 and 306 on and off. DC bias desired current for JFETs Q305 and Q306 are set by the resistors R314 and R317, respectively. In one embodiment, JFET Q306 comprises an enhancement mode JFET.

A transistor Q307 turns on during the time that DC bias current is needed for low side JFET Q306. In one embodiment, transistor Q307 comprises a bipolar device. In one such embodiment, transistor Q307 comprises a PNP type transistor. When the low side JFET Q306 is in its off state, the transistor Q307 is also in an off state, this deters possible power loss, for instance through R317.

In the off state, the gate voltage Vg can be in a negative voltage range, such as −3V to −10V. Without transistor Q307, resistor R317 could conduct a relatively high current, this is because the voltage across it would be the negative gate voltage plus the converter output voltage, Vo−Vg, Vg holding a negative value during the off period. During the off time, the power loss would be (Vo−Vg)² divided by the resistance value of resistor R317. For instance, where Vo is 1.5 Volts and Vg is −10 Volts, the power dissipated by R317 would be ((1.5V−(−10V))²)/$R_{R317}$=11.5²/$R_{R317}$=133.25/$R_{R317}$.

The base of Q307 is driven by R316 and C318 from the input signal voltage V3 to the JFET driver 310. Signal voltage V3 goes low to turn on low side JFET Q306. The source of Q307 is connected to the converter output voltage Vo, which in one embodiment has a range of 1.0V to 3.3V.

Q307 will turn on with the driver U310 voltage V3 near zero volts. In one embodiment, the base to emitter junction of Q307 is forward biased by Vo through R316 to turn on. The voltage across R317 is determined by the output voltage Vo, less the source-gate voltage Vgs of the JFET Q306, less the saturation voltage of Q307:

$$V_{R317} = Vo - Vgs_{Q306} - Vsat_{Q307}$$

The power loss from the output is the product of Vo and the bias current $I_{bias}$.

The capacitor C318 provides a speed up charge to turn Q307 on and off quickly. With V3 high, the output of the low side driver voltage V7 will be low and transistor Q307 will be off.

Where circuit 300 functions in a circuit application with a large duty cycle, the high side JFET Q305 gate bias can also be derived from the output voltage Vo to increase efficiency. The gate voltage of high side transistor Q305 may exceed +12V. Thus, the transistor configuration of circuit 300 can be used with an output voltage offset, for instance, to reference Vo to the source voltage of Q305. In one embodiment, this voltage offset is achieved with a switched capacitor. In another embodiment, another means of offsetting Vo is used.

Exemplary Process for Driving a JFET

Figure 4:
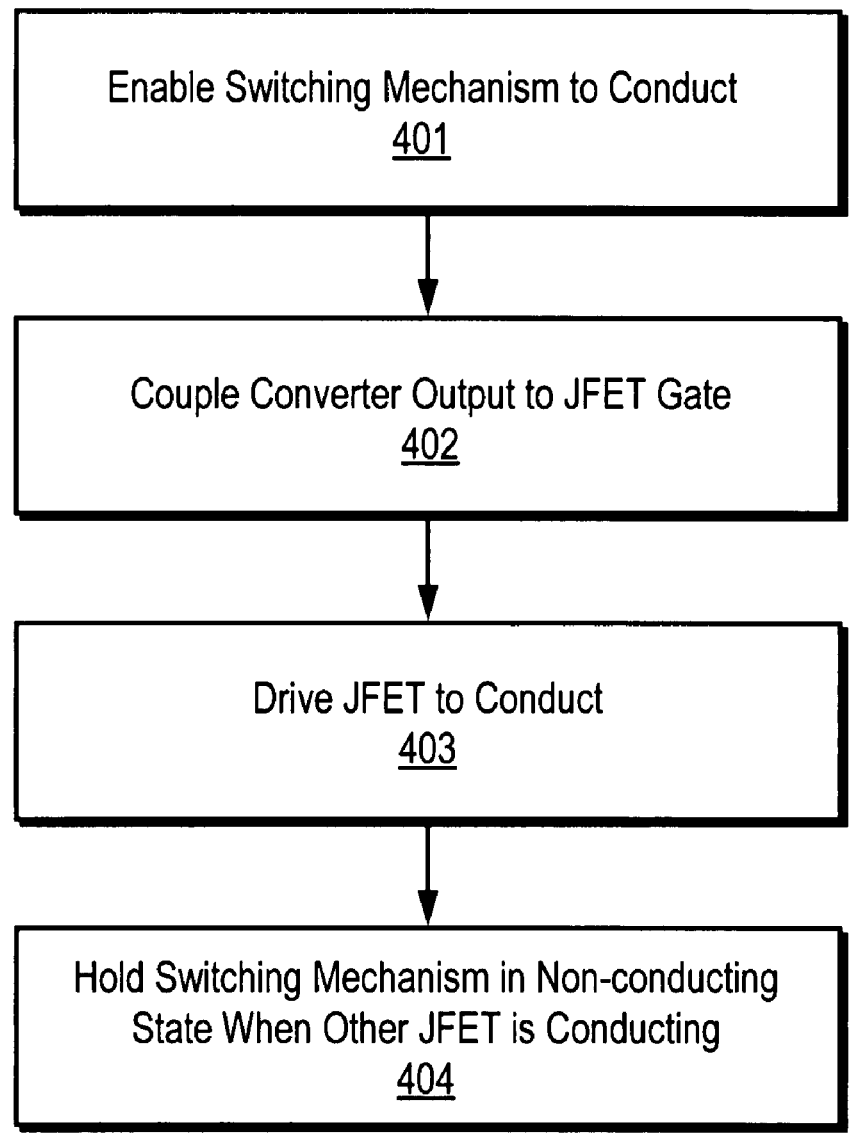
FIG. 4 is a flowchart of a method for driving a JFET, according to one embodiment of the present invention.

FIG. 4 is a flowchart of a process 400 for driving a JFET, such as an enhancement mode JFET in a converter circuit, according to one embodiment of the present invention. Process 400 begins with step 401, wherein a switching mechanism is enabled so as to conduct.

In one embodiment, the switching mechanism is a switching transistor, such as a bipolar transistor. In this embodiment, the switching transistor is enabled to conduct by coupling the input signal of the converter circuit to its base. Where the bipolar transistor is of type PNP, it is enabled to conduct when the converter circuit input is negative.

In step 402, upon enabling the switching mechanism to conduct, the output voltage of the converter circuit is coupled to the gate of the JFET. In step 403, upon coupling the output voltage of the converter circuit to the gate of the JFET, the JFET is driven into a conduction state, which can complete process 400.

In one embodiment, the JFET being driven in steps 401-403 can comprise a first, e.g., low side JFET, which is coupled to a second, e.g., high side JFET, for instance, from the source of the low side JFET to the drain of the high side JFET. The source of the high side JFET can be at Vcc and the drain of the low JFET at ground. In this embodiment, when the low side JFET conducts, the high side JFET is cut off, and vice versa.

The output voltage of the converter can be derived through an inductor capacitor network wherein the inductor is coupled at a node that couples the low side and high side JFETs. In the present embodiment, process 400 can conclude upon step 404, wherein the switching mechanism is held in a non-conducting state, effectively isolating the gate of the low side JFET when the high side JFET is conducting.

Exemplary Driving Circuit for a High Side JFET

Figure 5:
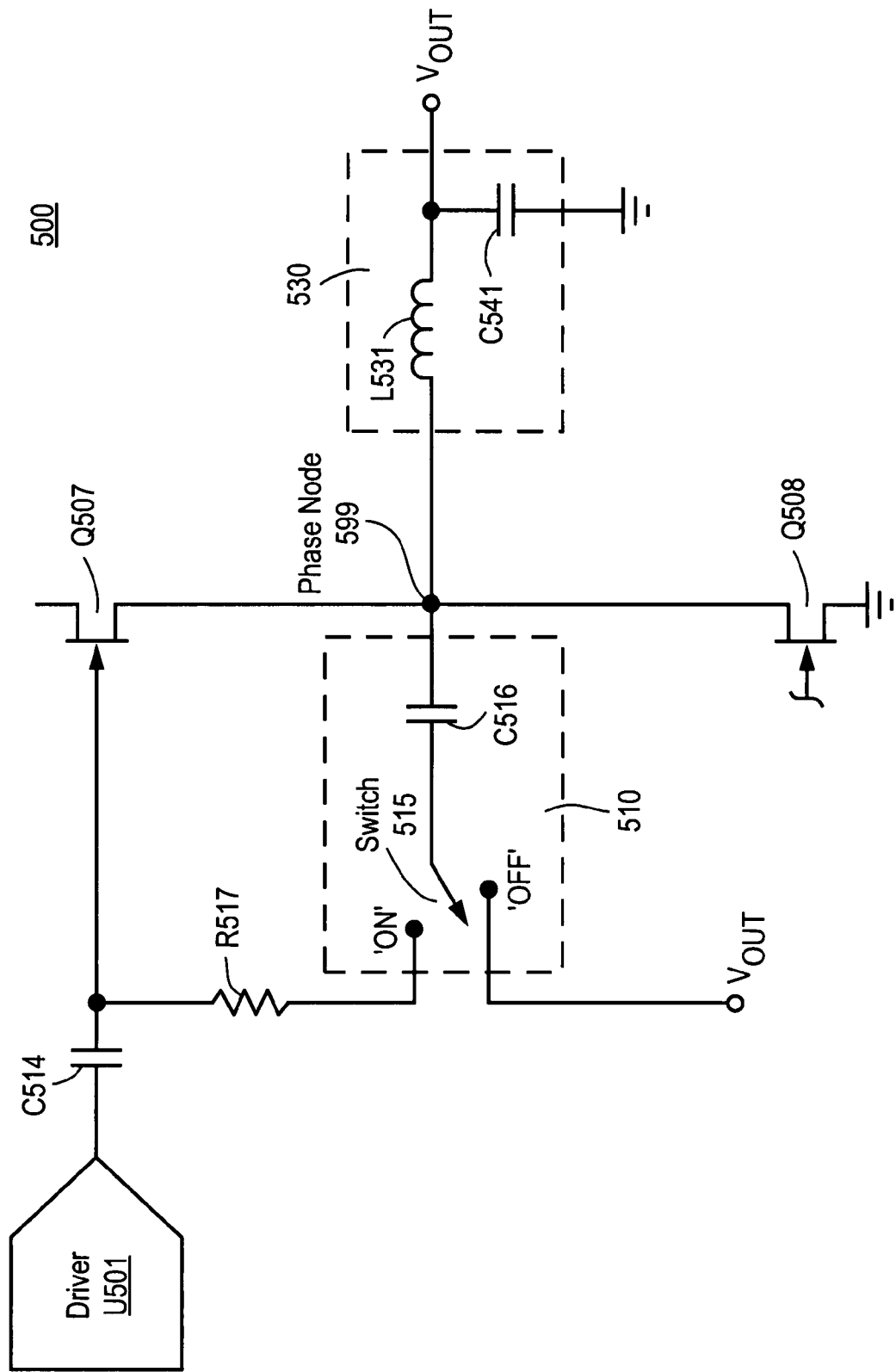
FIG. 5 depicts an exemplary driver circuit for the gate of a high side JFET in a converter output, according to one embodiment of the present invention.

FIG. 5 depicts an exemplary driver circuit 500 for the gate of a high side JFET in a converter output, according to one embodiment of the present invention. Circuit 500 has a low side JFET Q508 and a high side JFET Q507 and a gate driver U501. Circuit 500 also has a resistor R517 for setting the bias voltage for high side JFET Q507 and a capacitor C514.

A converter circuit 530 is comprised of inductor L531 and filter capacitor C541, coupled to the phase node 599 between high side JFET Q507 and low side JFET Q508. The converter circuit 530 has an output voltage Vout. In other respects, circuit 500 is similar to circuit 300 (FIG. 3), discussed above. For driving the high side JFET Q507, circuit 500 also includes a switched capacitor circuit 510.

Switched capacitor circuit 510 includes a capacitor C516, coupled to the phase node 599, and a switching device 515. In one embodiment, switching device 515 comprises a transistor and related biasing circuitry for controlling its conduction. When the transistor is driven to conduct, switching device 515 effectively closes, so as to couple capacitor C516 and resistor R517 in series with the gate of high side JFET Q507.

The discharge of capacitor C516 through switching device 515 drives high side JFET Q507 on (e.g., into a conduction state). When the transistor is not in conduction, switching device 515 is effectively open, which allows capacitor C516 to charge from Vout. The high side JFET Q507 conducts when low side JFET Q508 is in cut off.

Exemplary Process for Driving a High Side JFET

Figure 6:
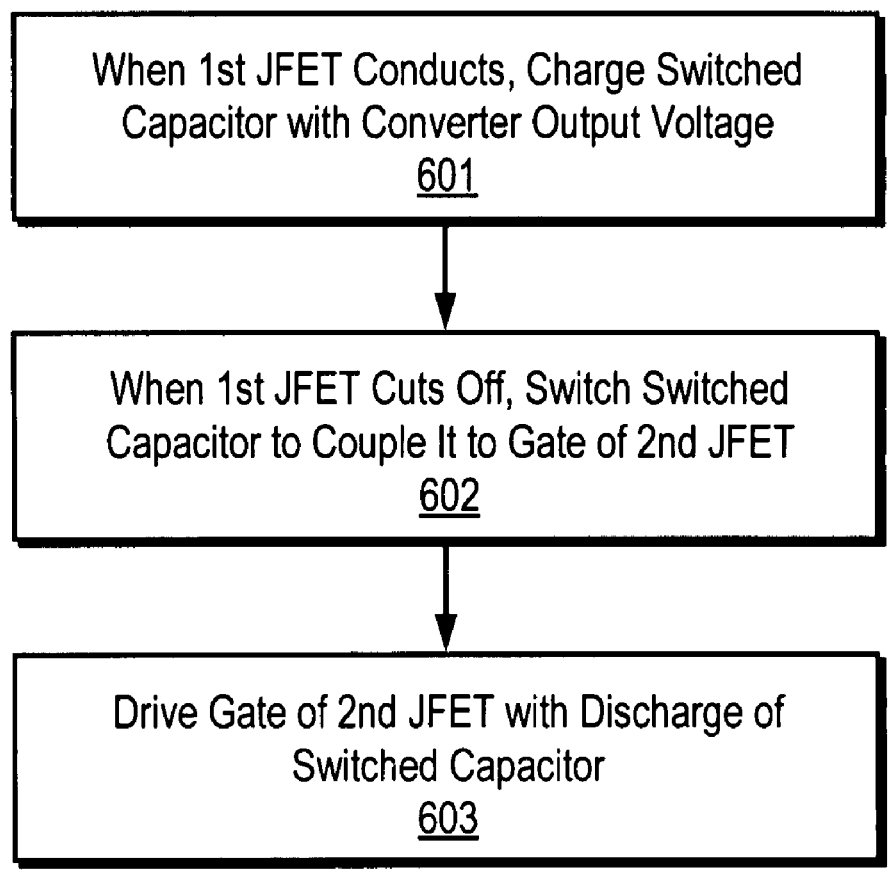
FIG. 6 is a flowchart of a method for driving a high side JFET, according to one embodiment of the present invention.

FIG. 6 is a flowchart of a process 600 for driving a high side JFET in a converter circuit, according to one embodiment of the present invention. The converter circuit has a low side JFET coupled to the high side JFET. The high side JFET is driven to conduct when low side JFET is held in cut off. Process 600 begins with step 601, wherein when the low side JFET is conducting, a switched capacitor is charged from the converter circuit output voltage.

In step 602, when the first JFET cuts off, the switched capacitor is switched so as to couple the switched capacitor to the gate of the high side JFET. In step 603, the switched capacitor is discharged, e.g., through a resistor coupling it in series to the gate of the high side JFET, developing a voltage that drives the high side JFET into a conduction state. Process 600 can be complete upon the high side JFET conducting.

Exemplary Switching Circuits

Figure 7:
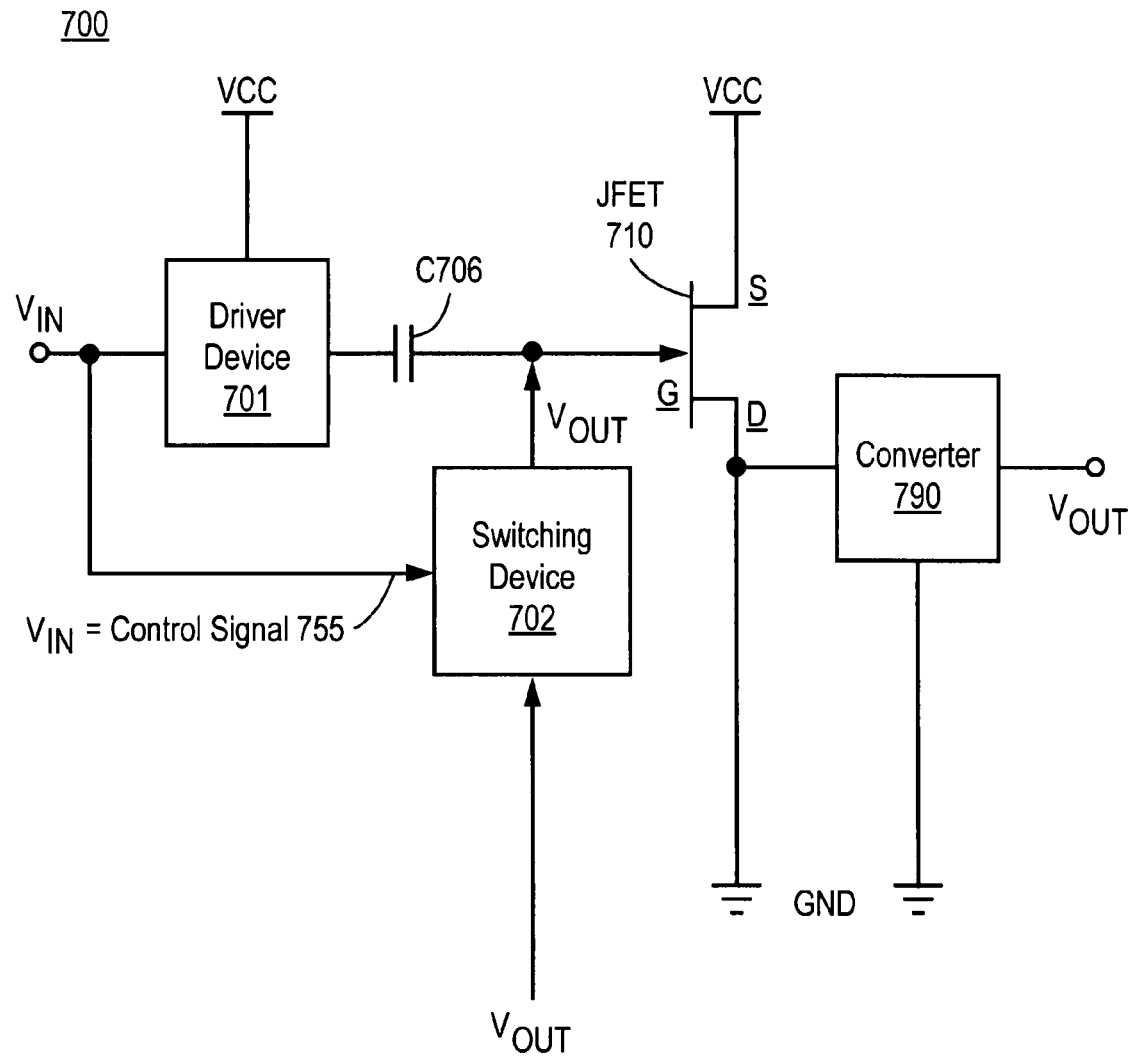
FIG. 7 depicts one switching circuit, according to one embodiment of the present invention.

FIG. 7 depicts a switching circuit 700, according to one embodiment of the present invention. Switching circuit 700 includes a driver device 701. Driver device 701 has a signal input Vin, a supply voltage input Vcc, and an output, which is coupled to a capacitance C706. In one embodiment, driver device 701 comprises a device characteristic of those for driving MOSFETs.

Capacitance C706 capacitively couples the output of driver device 701 to a JFET 710 having a gate G, a source S, and a drain D. JFET 710 comprises, in one embodiment, an enhancement mode JFET. A converter 790 couples to JFET 710 and provides an output Vout of switching circuit 700. A switching device 702 couples switching circuit 700 output Vout to the gate G of JFET 710.

Switching circuit 700 output provides voltage to drive the gate G upon enabling by the signal input Vin of the driver device 701. In one embodiment, the switching device 702 comprises a transistor (e.g., and related biasing circuitry). Coupling switching circuit 700 output voltage Vout to gate G of JFET 710 is enabled by biasing the switching device 702 transistor to conduct. In one embodiment, the switching device 702 transistor comprises a bipolar transistor. In one such embodiment, the transistor is of type PNP. In one embodiment, converter 790 and drain D of JFET 710 are coupled to a ground Gnd.

Figure 8:
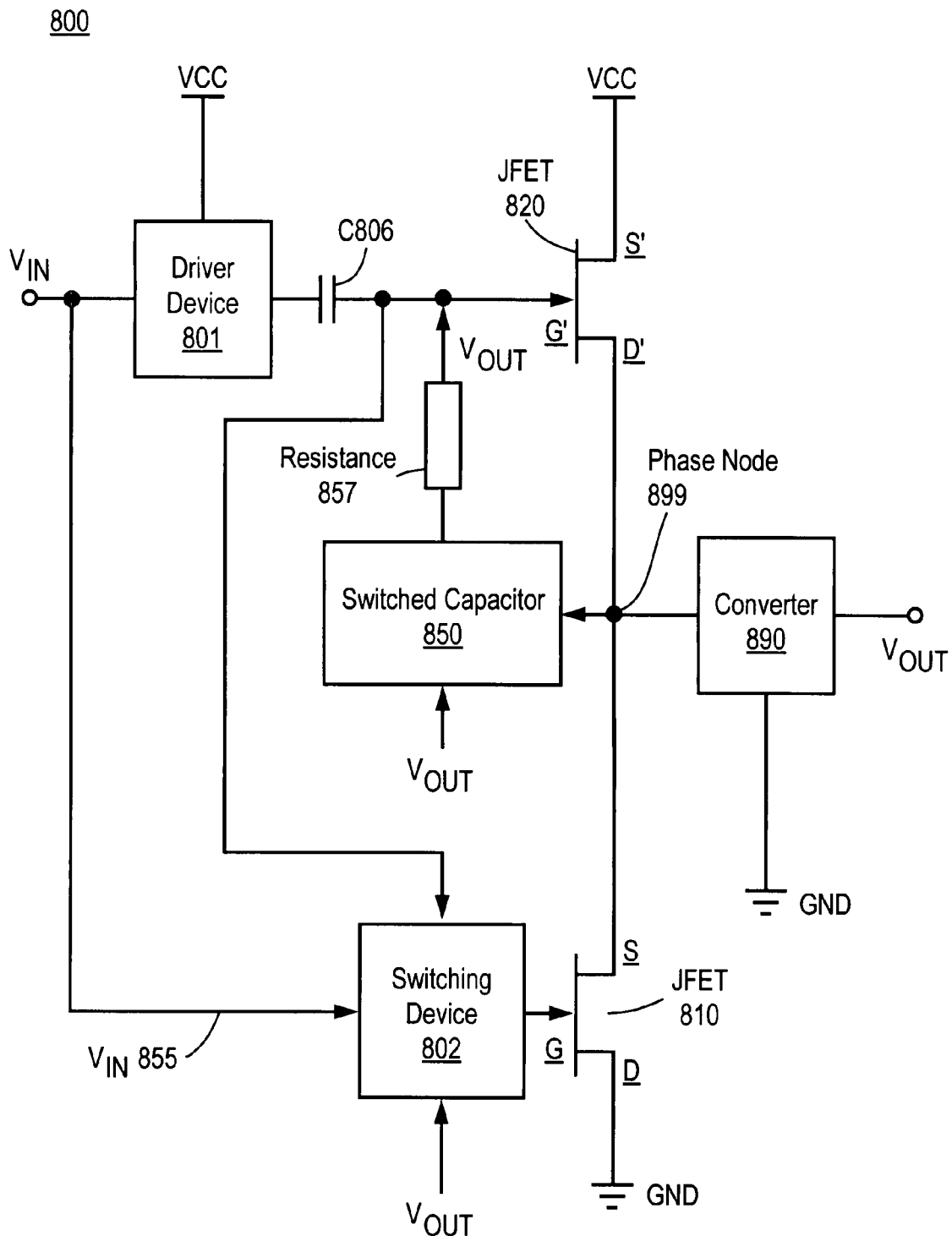
FIG. 8 depicts another switching circuit, according to one embodiment of the present invention.

FIG. 8 depicts a switching circuit 800, according to one embodiment of the present invention. Switching circuit 800 includes a driver device 801. Driver device 801 has a signal input Vin, a supply voltage input Vcc, and an output, which is coupled to a capacitance C806. In one embodiment, driver device 801 comprises a device characteristic of those for driving MOSFETs.

Capacitance C806 capacitively couples the output of driver device 801 to a JFET 810 having a gate G, a source S, and a drain D. A converter 890 couples to JFET 810 and provides an output Vout of switching circuit 800. A switching device 802 couples switching circuit 800 output Vout to the gate G of JFET 810.

Switching circuit 800 output provides voltage to drive the gate G of JFET 810 upon enabling by the signal input Vin of the driver device 801. In one embodiment, the switching device 802 comprises a transistor (e.g., and related biasing circuitry). Coupling switching circuit 800 output voltage Vout to gate G of JFET 810 is enabled by biasing the switching device 802 transistor to conduct. In one embodiment, the switching device 802 transistor comprises a bipolar transistor. In one such embodiment, the transistor is of type PNP.

Switching circuit 800 also comprises a JFET 820, which is coupled to JFET 810 at a phase node 899, from drain D' of JFET 820 to source S of JFET 810. JFETs 810 and 820 are characterized by the same mode type, and in one embodiment comprise enhancement mode JFETs. JFETs 810 and 820 respectively conduct during different phase cycles one from another. For instance, JFET 810 conducts when Vin swings negative and JFET 820 conducts when Vin swings positive. Thus, JFET 820 functions as a high side JFET and JFET 810 functions as a low side JFET for switching circuit 800. In one embodiment, converter 890 and drain D of JFET 810 are coupled to a ground Gnd.

In one embodiment, switching circuit 800 includes a switched capacitor 850. Switched capacitor 850 provides current to drive high side JFET 820, such as with developing bias voltage through a resistance 857. Switched capacitor 850 switches to drive JFET 820 when JFET 810 cuts off. When JFET 820 cuts off, the switched capacitor 850 is charged by Vout. When JFET 820 is conducting, the gate G of JFET 810 is held at a negative voltage. In one embodiment, this negative voltage is in a range substantially between −3 Volts and −10 Volts. In one embodiment, Vout is in a range substantially between 1 Volt and 3.5 Volts. In one embodiment, switching circuit 800 (or e.g., switching circuit 700; FIG. 7) comprises part of a direct current (DC) converter.

In summary, a switching circuit of an embodiment of the present invention includes a driver device having a signal input, a supply voltage input, and an output. The driver output is coupled (e.g., capacitively) to a JFET (e.g., an enhancement mode JFET). A converter (e.g., a DC converter) couples to the JFET and provides an output of the switching circuit. When enabled, a switching device couples this switching circuit output to the gate of the JFET, thus causing the JFET to be driven into conduction.

Embodiments of the present invention, a circuit and method for driving a field effect transistor gate, are thus described. While the present invention has been described in particular embodiments, it should be appreciated that the present invention should not be construed as limited by such embodiments, but rather construed according to the following claims and their equivalents.

What is claimed is:

1. A switching circuit comprising:
   a driver device having a signal input, a supply voltage input, and an output;
   a junction field effect transistor having a gate, a source, and a drain, wherein said driver device output is capacitively coupled to said gate;
   a converter coupled to said junction field effect transistor and providing an output of said switching circuit; and
   a switching device for receiving said switching circuit output as an input signal and providing a voltage to drive said gate, wherein said switching device is enabled with said driver device signal input.

2. The switching circuit of claim 1 wherein said switching device comprises a transistor and wherein said switching device is enabled by biasing said switching device transistor to conduct.

3. The switching circuit of claim 2 wherein said transistor comprises a bipolar transistor.

4. The switching circuit of claim 3 wherein said bipolar transistor comprises a type PNP transistor.

5. The switching circuit of claim 1 wherein said junction field effect transistor comprises an enhancement mode junction field effect transistor.

6. The switching circuit of claim 1 wherein said junction field effect transistor comprises a first junction field effect transistor, said switching circuit further comprising a second junction field effect transistor wherein said second junction field effect transistor is coupled to said first junction field effect transistor, wherein said first and said second junction field effect transistors are characterized by the same mode type, and wherein said first and said second junction field effect transistors conduct during different phase cycles one from another.

7. The switching circuit of claim 6 further comprising a switched capacitor, wherein said switched capacitor provides a current to bias a gate of said second junction field effect transistor and wherein said switched capacitor is charged with said switching circuit output.

8. The switching circuit of claim 1 wherein, when said junction field effect transistor is not conducting, said gate is held at a negative voltage.

9. The switching circuit of claim 1 wherein said driver device comprises a metal oxide semiconductor field effect transistor driver.

10. A method for driving a junction field effect transistor in a converter circuit, said method comprising:
    enabling a switching mechanism to conduct;
    upon said enabling, receiving an output voltage of said converter circuit as an input signal to the switching mechanism and providing a voltage to drive a gate of said junction field effect transistor; and
    upon said coupling, driving said junction field effect transistor to conduct.

11. The method of claim 10 wherein said switching mechanism comprises a switching transistor and wherein said enabling comprises coupling an input signal for said converter circuit to bias said switching transistor to conduct.

12. The method of claim 11 wherein said junction field effect transistor comprises a first junction field effect transistor, said converter circuit also having a second junction field effect transistor, said second junction field effect transistor coupled to said first junction field effect transistor, and wherein said first and said second junction field effect transistors conduct during different phase cycles one from another.

13. The method of claim 12 further comprising, when said second field effect transistor is conducting, maintaining said switching transistor in a non-conducting state.

14. The method of claim 12 further comprising:
when said first field effect transistor is conducting, charging a switched capacitor with said converter circuit output voltage;
when said first junction field effect transistor cuts off, switching said switched capacitor to couple said switched capacitor to a gate of said second junction field effect transistor; and
discharging said switched capacitor, wherein said discharging drives said second junction field effect transistor.

15. The method of claim 14 wherein said first and said second junction field effect transistors are characterized by the same mode type.

16. The method of claim 10 wherein said junction field effect transistor comprises an enhancement mode junction field effect transistor.

17. A direct current converter comprising:
a first junction field effect transistor for performing part of a switching function;
a second junction field effect transistor for performing part of said switching function, coupled to said first junction field effect transistor, wherein said first and said second junction field effect transistors conduct during different phase cycles one from another of operation of said converter and wherein, when said first and said second junction field effect transistors are not conducting, the gates thereof are held at a negative voltage;
a converter coupled to said first and said second junction field effect transistors and providing an output of said direct current converter;
a metal oxide semiconductor field effect transistor driver device having a signal input and a driving device output, wherein said driving device output is capacitively coupled to gates of said first and said second junction field effect transistors; and
a switching device for coupling the output of said direct current converter to drive said gate of said first junction field effect transistor, wherein said coupling said switching circuit output to said gate is enabled with said driver device signal input.

18. The direct current converter of claim 17 wherein said switching device comprises a bipolar transistor and wherein said coupling said output of said direct current converter is enabled by biasing said switching device transistor to conduct.

19. The direct current converter of claim 18 wherein said bipolar transistor comprises a type PNP transistor.

20. The direct current converter of claim 17 further comprising a switched capacitor, wherein said switched capacitor drives the gate of said second junction field effect transistor and wherein said switched capacitor is charged with said output of said direct current converter.

21. The direct current converter of claim 17 wherein said output of said direct current converter is in a range substantially between 1 Volt and 3.5 Volts.

22. The direct current converter of claim 17 wherein said negative voltage is in a range substantially between −3 Volts and −10 Volts.

* * * * *